(12) United States Patent
Samir et al.

(10) Patent No.: US 9,499,905 B2
(45) Date of Patent: Nov. 22, 2016

(54) METHODS AND APPARATUS FOR THE DEPOSITION OF MATERIALS ON A SUBSTRATE

(75) Inventors: Mehmet Tugrul Samir, Mountain View, CA (US); Nyi Oo Myo, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 627 days.

(21) Appl. No.: 13/547,487

(22) Filed: Jul. 12, 2012

(65) Prior Publication Data

US 2013/0019803 A1 Jan. 24, 2013

Related U.S. Application Data

(60) Provisional application No. 61/510,828, filed on Jul. 22, 2011.

(51) Int. Cl.
*C23C 16/455* (2006.01)

(52) U.S. Cl.
CPC ..... *C23C 16/45504* (2013.01); *C23C 16/4557* (2013.01); *C23C 16/4558* (2013.01);
(Continued)

(58) Field of Classification Search
CPC ............ C23C 16/45563; C23C 16/45565; C23C 16/45568; C23C 16/4557; C23C
(Continued)

(56) References Cited

U.S. PATENT DOCUMENTS

| 4,496,609 A | * | 1/1985 | McNeilly | ............... C30B 25/12 117/88 |
| 4,687,544 A | * | 8/1987 | Bersin | ............... H01J 37/32339 156/345.35 |

(Continued)

FOREIGN PATENT DOCUMENTS

JP H07-312348 A 11/1995

OTHER PUBLICATIONS

Search Report from the State Intellectual Property Office of the People's Republic of China received Chinese National Phase Application No. 201280036316.5.
(Continued)

*Primary Examiner* — Rudy Zervigon
(74) *Attorney, Agent, or Firm* — Moser Taboada; Alan Taboada

(57) ABSTRACT

Methods and apparatus for deposition of materials on substrates are provided herein. In some embodiments, an apparatus may include a process chamber having a substrate support; a heating system to provide heat energy to the substrate support; a gas inlet port disposed to a first side of the substrate support to provide at least one of a first process gas or a second process gas across a processing surface of the substrate; a first gas distribution conduit disposed above the substrate support and having one or more first outlets disposed along the length of the first gas distribution conduit to provide a third process gas to the processing surface of the substrate, wherein the one or more first outlets are substantially linearly arranged; and an exhaust manifold disposed to a second side of the substrate support opposite the gas inlet port to exhaust the process gases from the process chamber.

20 Claims, 6 Drawing Sheets

(52) U.S. Cl.
CPC ... *C23C 16/45563* (2013.01); *C23C 16/45565* (2013.01); *C23C 16/45568* (2013.01); *C23C 16/45572* (2013.01); *C23C 16/45574* (2013.01); *C23C 16/45578* (2013.01)

(58) Field of Classification Search
CPC .................. 16/45572;C23C 16/45574; C23C 16/45578; C23C 16/4558
USPC .............. 118/715, 725; 156/345.33, 345.34, 156/345.52
See application file for complete search history.

(56) References Cited

U.S. PATENT DOCUMENTS

| | | | | |
|---|---|---|---|---|
| 4,800,105 A * | 1/1989 | Nakayama | C23C 16/455 | 427/253 |
| 4,849,260 A * | 7/1989 | Kusumoto | C23C 16/14 | 257/E21.171 |
| 4,924,807 A * | 5/1990 | Nakayama | C23C 16/455 | 118/50.1 |
| 4,994,301 A * | 2/1991 | Kusumoto | C23C 16/045 | 427/124 |
| 5,024,182 A * | 6/1991 | Kobayashi | C23C 16/452 | 118/715 |
| 5,030,319 A * | 7/1991 | Nishino | H01L 21/76802 | 134/1 |
| 5,551,982 A * | 9/1996 | Anderson | C23C 16/455 | 118/715 |
| 5,683,537 A * | 11/1997 | Ishii | H01J 37/32082 | 118/723 I |
| 5,851,589 A * | 12/1998 | Nakayama | C23C 16/08 | 427/248.1 |
| 5,914,050 A * | 6/1999 | Comita | C23C 16/4405 | 118/715 |
| 5,916,369 A * | 6/1999 | Anderson | C23C 16/455 | 118/715 |
| 6,013,155 A * | 1/2000 | McMillin | C23C 16/455 | |
| 6,095,085 A | 8/2000 | Agarwal | | |
| 6,113,703 A * | 9/2000 | Anderson | C23C 16/455 | 118/724 |
| 6,143,081 A * | 11/2000 | Shinriki | C23C 16/405 | 118/715 |
| 6,153,260 A * | 11/2000 | Comita | C23C 16/4408 | 118/719 |
| 6,228,173 B1 * | 5/2001 | Okase | C23C 16/56 | 118/641 |
| 6,232,248 B1 * | 5/2001 | Shinriki | C23C 16/405 | 257/E21.01 |
| 6,245,149 B1 * | 6/2001 | de Lomenie | C23C 16/4405 | 118/715 |
| 6,281,141 B1 * | 8/2001 | Das | H01L 21/0214 | 257/E21.268 |
| 6,301,434 B1 * | 10/2001 | McDiarmid | C23C 16/4404 | 118/724 |
| 6,383,330 B1 * | 5/2002 | Raaijmakers | C23C 16/44 | 118/715 |
| 6,399,922 B2 * | 6/2002 | Okase | C23C 16/56 | 118/724 |
| 6,402,848 B1 * | 6/2002 | Horiguchi | C23C 16/405 | 118/715 |
| 6,450,117 B1 | 9/2002 | Murugesh et al. | | |
| 6,455,814 B1 * | 9/2002 | Samoilov | C23C 16/481 | 118/50.1 |
| 6,488,776 B2 * | 12/2002 | Wang | C23C 16/24 | 118/663 |
| 6,537,422 B2 * | 3/2003 | Sakuma | C23C 16/46 | 118/724 |
| 6,540,837 B2 * | 4/2003 | Raaijmakers | C23C 16/44 | 118/715 |
| 6,655,284 B1 | 12/2003 | Hoshii et al. | | |
| 6,774,040 B2 * | 8/2004 | Comita | C30B 29/06 | 257/E21.102 |
| 7,037,560 B1 * | 5/2006 | Shinriki | C23C 16/405 | 427/255.31 |
| 7,118,781 B1 * | 10/2006 | Sumakeris | C23C 16/4401 | 427/248.1 |
| 7,156,921 B2 * | 1/2007 | Byun | B82Y 10/00 | 118/50 |
| 7,252,716 B2 * | 8/2007 | Kim | C23C 16/4558 | 118/715 |
| 7,520,245 B2 * | 4/2009 | Ohmi et al. | 118/723 MW | |
| 7,655,543 B2 * | 2/2010 | Bauer | C23C 16/04 | 427/255.28 |
| 7,887,670 B2 * | 2/2011 | Koizumi | C23C 16/45574 | 118/715 |
| 7,964,038 B2 * | 6/2011 | Patalay | H01L 21/68785 | 118/728 |
| 7,976,634 B2 * | 7/2011 | Carlson | C23C 16/22 | 118/724 |
| 7,987,814 B2 * | 8/2011 | Carducci | H01J 37/32082 | 118/723 R |
| 8,349,083 B2 * | 1/2013 | Takasuka | C23C 16/4401 | 118/715 |
| 8,398,813 B2 * | 3/2013 | Kobayashi | H01J 37/32192 | 156/345.31 |
| 8,486,191 B2 * | 7/2013 | Aggarwal | C23C 16/04 | 118/715 |
| 8,663,390 B2 * | 3/2014 | Carlson | C23C 16/22 | 118/724 |
| 2001/0015261 A1 * | 8/2001 | Kobayashi | H01J 37/32082 | 156/345.41 |
| 2001/0018267 A1 * | 8/2001 | Shinriki | C23C 16/405 | 438/680 |
| 2002/0000199 A1 * | 1/2002 | Harada | C23C 16/34 | 118/715 |
| 2002/0014471 A1 * | 2/2002 | Donohoe | C23C 16/4405 | 216/67 |
| 2002/0022379 A1 * | 2/2002 | Ashizawa | H01L 21/02183 | 438/785 |
| 2003/0037879 A1 * | 2/2003 | Askarinam | C23C 16/4411 | 156/345.33 |
| 2003/0037880 A1 * | 2/2003 | Carducci | H01J 37/32522 | 156/345.43 |
| 2004/0050326 A1 * | 3/2004 | Thilderkvist | C23C 16/45561 | 118/715 |
| 2005/0277272 A1 * | 12/2005 | Singh | C23C 16/482 | 438/479 |
| 2007/0134919 A1 * | 6/2007 | Gunji | C23C 16/16 | 438/680 |
| 2007/0170148 A1 * | 7/2007 | Kuppurao | C23C 16/452 | 216/58 |
| 2007/0289534 A1 * | 12/2007 | Lubomirsky | C23C 16/452 | 118/723 R |
| 2008/0069951 A1 | 3/2008 | Chacin et al. | | |
| 2008/0178810 A1 * | 7/2008 | Koizumi | C23C 16/45589 | 118/730 |
| 2008/0220150 A1 * | 9/2008 | Merry | C23C 16/45591 | 427/8 |
| 2008/0274604 A1 * | 11/2008 | Sanchez | C23C 16/4581 | 438/507 |
| 2009/0283038 A1 | 11/2009 | Gunji et al. | | |
| 2010/0075488 A1 * | 3/2010 | Collins | C23C 16/45551 | 438/507 |
| 2010/0267249 A1 | 10/2010 | Kim et al. | | |
| 2010/0308729 A1 * | 12/2010 | Ramachandran | H01K 1/66 | 315/73 |
| 2011/0135842 A1 * | 6/2011 | Faguet | C23C 16/4401 | 427/569 |
| 2011/0209660 A1 * | 9/2011 | Myo | C23C 16/4586 | 117/88 |
| 2011/0240598 A1 * | 10/2011 | Okayama | C23C 16/452 | 216/69 |
| 2012/0234243 A1 * | 9/2012 | Olgado | C23C 16/4584 | 118/730 |
| 2012/0240853 A1 * | 9/2012 | Carlson | C23C 16/4404 | 118/715 |
| 2012/0266819 A1 * | 10/2012 | Sanchez | C23C 16/4412 | 118/719 |

(56) References Cited

U.S. PATENT DOCUMENTS

| | | | |
|---|---|---|---|
| 2012/0270384 A1* | 10/2012 | Sanchez | C23C 16/0236 438/503 |
| 2013/0019803 A1* | 1/2013 | Samir | C23C 16/45578 118/725 |
| 2013/0109159 A1* | 5/2013 | Carlson | C23C 16/45565 438/503 |
| 2013/0269613 A1* | 10/2013 | Sanchez | H01L 21/02104 118/724 |
| 2014/0026816 A1* | 1/2014 | Myo | B05B 9/03 118/728 |
| 2014/0030433 A1* | 1/2014 | Ranish | B05C 5/00 427/248.1 |
| 2014/0083360 A1* | 3/2014 | Samir | H01L 21/02104 118/715 |
| 2014/0137801 A1* | 5/2014 | Lau | C30B 25/14 118/728 |
| 2014/0261185 A1* | 9/2014 | Aboagye | C23C 16/4411 118/728 |
| 2014/0326185 A1* | 11/2014 | Lau | C23C 16/45563 118/728 |
| 2014/0345525 A1* | 11/2014 | Ranish | H01L 21/02293 118/715 |

OTHER PUBLICATIONS

International Search Report and Written Opinion mailed Jan. 24, 2013 for PCT Application No. PCT/US2012/047606.

\* cited by examiner

METHODS AND APPARATUS FOR THE DEPOSITION OF MATERIALS ON A SUBSTRATE

CROSS-REFERENCE TO RELATED APPLICATIONS

This application claims benefit of U.S. provisional patent application Ser. No. 61/510,828, filed Jul. 22, 2011, which is herein incorporated by reference.

FIELD

Embodiments of the present invention generally relate to methods and apparatus for the deposition of materials on a substrate.

BACKGROUND

As the critical dimensions of complementary metal oxide semiconductor (CMOS) devices continue to shrink, novel materials need to be incorporated into CMOS architecture, for example, to improve energy efficiency and/or speed. An exemplary but non-limiting such group of materials, which may be utilized, for example, in the channel of a transistor device, is III-V materials. Unfortunately, current processing apparatus and methods fail to yield films having suitable material quality, such as low defect density, composition control, high purity, morphology, in-wafer uniformity, and run to run reproducibility.

Accordingly, the inventors have provided improved methods and apparatus for the deposition of materials on a substrate.

SUMMARY

Methods and apparatus for deposition of materials on substrates are provided herein. In some embodiments, an apparatus may include a process chamber having a substrate support; a heating system to provide heat energy to the substrate support; a gas inlet port disposed to a first side of the substrate support to provide at least one of a first process gas or a second process gas across a processing surface of the substrate; a first gas distribution conduit disposed above the substrate support and having one or more first outlets disposed along the length of the first gas distribution conduit to provide a third process gas to the processing surface of the substrate, wherein the one or more first outlets are substantially linearly arranged; and an exhaust manifold disposed to a second side of the substrate support opposite the gas inlet port to exhaust the process gases from the process chamber.

In some embodiments, an apparatus may include a process chamber having a temperature-controlled reaction volume including interior surfaces comprising quartz and having a substrate support disposed within the temperature-controlled reaction volume to support a substrate; a heating system to provide heat energy to the substrate support; an gas inlet port disposed to a first side of the substrate support to provide one or more gases across a processing surface of the substrate; a first conduit disposed above the substrate support and having a plurality of first outlets disposed along the length of the first conduit to provide at least one of the first process gas or a second gas to the processing surface of the substrate, wherein the plurality of first outlets are substantially linearly arranged along the length of the first conduit ranging from above about a center of the substrate support to above about a peripheral edge of the substrate support; and an exhaust manifold disposed to a second side of the substrate support, opposite the gas inlet port, to exhaust the first and second process gases from the process chamber.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
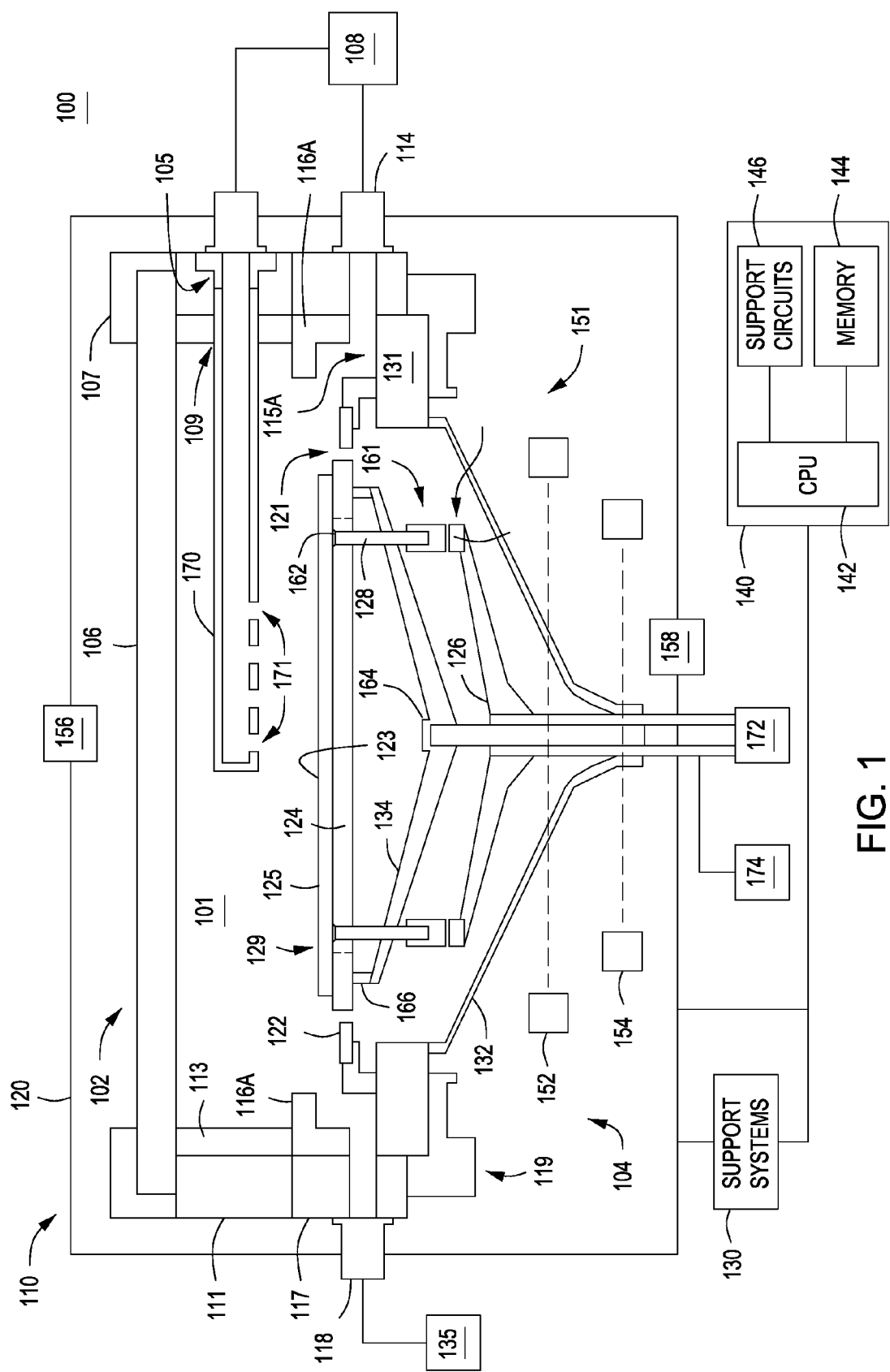
FIG. 1 depicts a schematic side view of a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for deposition of materials on a substrate are provided herein. In some embodiments, the methods and apparatus may advantageously be used to deposit advanced compound thin films, such as those including one or more of III-V materials, silicon germanium (SiGe), silicon carbon (SiC), or germanium tin (GeSn) on a substrate. For example, embodiments of the inventive methods and apparatus may advantageously provide for the improved deposition of such films, for example, for use in CMOS applications. In at least some embodiments, the improved apparatus may meet some or all of the expectations placed by the mainstream semiconductor industry on current epitaxial silicon and silicon-germanium reactors. For example, in some embodiments, the improved apparatus may facilitate epitaxial film growth on, for example, a 300 mm silicon wafer, with better material quality (e.g., one or more of lower defect density, good composition control, higher purity, good morphology, and higher uniformity)

within a particular substrate and from run to run, as compared to conventional commercial reactors. In at least some embodiments, the improved apparatus may provide reliable operation and extended reactor (and process) stability, with much less residue accumulation for less frequent maintenance cycles and intervention. Thus, the improved apparatus and methods of use described herein may advantageously provide for improved deposition of materials in CMOS device production as compared to conventional commercial reactors.

FIG. 1 depicts a schematic side view of a process chamber 100 in accordance with some embodiments of the present invention. In some embodiments, the process chamber 100 may be modified from a commercially available process chamber, such as the RP EPI®, reactor, available from Applied Materials, Inc. of Santa Clara, Calif., or any other suitable semiconductor process chamber adapted for performing epitaxial silicon deposition processes. The process chamber 100 may be adapted for performing epitaxial deposition processes, for example as discussed below with respect to the method of FIG. 4, and illustratively comprises a chamber body 110, a temperature-controlled reaction volume 101, a gas inlet port 114, a first gas distribution conduit 170, and an exhaust manifold 118. The process chamber 100 may further include support systems 130, and a controller 140, as discussed in more detail below.

The gas inlet port 114 may be disposed on a first side 121 of a substrate support 124 disposed inside the chamber body 110 to provide a plurality of process gases, such as at least one of a first process gas or a second process gas across a processing surface 123 of a substrate 125 when the substrate is disposed in the substrate support 124. The plurality of process gases may be provided, for example, from a gas panel 108 coupled to the gas inlet port 114. The gas inlet port 114 may be coupled to a space 115A, as illustrated in FIG. 1, formed by one or more chamber liners of the temperature-controlled reaction volume 101 to provide the at least one of the first process gas or the second process gas across the processing surface 123 of the substrate 125. Alternatively, the gas inlet port 114 may be fluidly coupled to the temperature-controlled reaction volume 101 via an injector 115B (as described in FIGS. 3A-C). The injector 115B may have a first flow path to provide the first process gas and a second flow path to provide the second process gas independent of the first process gas. Embodiments of the space 115A and the injector 115B are described below with respect to FIGS. 1 and 3A-C, respectively.

The exhaust manifold 118 may be disposed to a second side 129 of the substrate support 124, opposite the gas inlet port 114, to exhaust the first and second process gases from the process chamber 100. The exhaust manifold 118 may include an opening that is about the same width as the diameter of the substrate 125 or larger. The exhaust manifold may include an adhesion reducing liner (not shown). For example, the adhesion reducing liner may comprise one or more of quartz, nickel impregnated fluoropolymer, or the like. The exhaust manifold 118 may be heated, for example, to reduce deposition of materials on surfaces of the exhaust manifold 118. The exhaust manifold 118 may be coupled a vacuum apparatus 135, such as vacuum pump, abatement system, or the like to exhaust any process gases exiting the chamber 100.

The chamber body 110 generally includes an upper portion 102, a lower portion 104, and an enclosure 120. The upper portion 102 is disposed on the lower portion 104 and includes a chamber lid 106 and an upper chamber liner 116A, and a spacer liner 113. In some embodiments, an upper pyrometer 156 may be provided to provide data regarding the temperature of the processing surface of the substrate during processing. A clamp ring 107 may be disposed atop the chamber lid 106 to secure the chamber lid 106. The chamber lid 106 may have any suitable geometry, such as flat (as illustrated) or having a dome-like shape (not shown), or other shapes, such as reverse curve lids are also contemplated. In some embodiments, the chamber lid 106 may comprise a material, such as quartz or the like. Accordingly, the chamber lid 106 may at least partially reflect energy radiated from the substrate 125 and/or from lamps disposed below the substrate support 124. For example, the first gas distribution conduit 170 may comprise a material such as quartz or the like, for example, to at least partially reflect energy as discussed above.

The spacer liner 113 may be disposed above the upper chamber liner 116A and below the chamber lid 106 as depicted in FIG. 1. The spacer liner 113 may be disposed on an inner surface of a spacer ring 111, where the spacer ring 111 is disposed in the chamber body 110 between the chamber lid 106 and a portion 117 of the chamber body 110 coupled to the gas inlet port 114 and the exhaust manifold 118. The spacer ring 111 may be removable and/or interchangeable with existing chamber hardware. For example, the spacer ring 111 including the spacer liner 113 and the first gas distribution conduit 170 (and optionally, additional conduits) may be retrofit to existing process chambers by inserting the spacer ring 111 between the chamber lid 106 and the portion 117 of the chamber body 110. In some embodiments, the spacer liner 113 may comprise a material, such as quartz or the like. The spacer liner 113 may include a first opening 109, where the first gas distribution conduit 170 extends through the first opening 109 in the spacer liner 113 and into the process chamber 100. For example, a corresponding opening 105 may be present in the spacer ring 111 to accept and/or mount the first gas distribution conduit 170 thereon and therethrough.

The first gas distribution conduit 170 may be disposed above the substrate support 124 (e.g., opposing the substrate support 124) to provide a third process gas to the processing surface 123 of the substrate 125. The third process gas may be the same as the first process gas, the same as the second process gas, or different than the first and second process gases provided by the gas inlet port 114. In some embodiments, the third process gas is the same as the first process gas. The third process gas may also be provided, for example, from the gas panel 108 (or from another suitable gas source).

In some embodiments, the first gas distribution conduit 170 may be a substantially linear member, although other shapes may be used. In some embodiments, the first gas distribution conduit 170 is advantageously not a large circular element that covers substantially the entire substrate (e.g., a conventional showerhead), thereby facilitating ease of manufacture, reduced cost, or the like. The first gas distribution conduit 170 may include one or more first outlets 171 disposed along the length of the first gas distribution conduit 170 to provide the third process gas to the processing surface 123 of the substrate 125. The one or more first outlets 171 may be substantially linearly arranged, as illustrated In FIG. 1, 2A-D or 3A. As used herein, the term "substantially linearly arranged" may be taken to mean "linear" or "approximately linear". Each first outlet 171 may have any desired diameter or the like. For example, the diameter or the like of each first outlet 171 may be selected such that each first outlet 171 provides a desired flow rate of the third process gas. For example, a first outlet 171 proximate a center 202 of the substrate support 124 may have a different diameter or the like than that of any other first outlet 171, for example, a first outlet 171 located proximate a peripheral edge of the 204 of the substrate support 124, such as to provide approximately the same and/or any desired flow velocity, mass flow rate, or the like at each location.

The first gas distribution conduit 170 may assume any desired shape (e.g., cross section and shape along the length of the conduit) in addition to the tubular shape illustrated in FIGS. 2A-D. For example, the shape of the first gas distribution conduit 170 may be used to provide the same and/or any desired flow rate for each first outlet 171 along the length of the first gas distribution conduit 170. For example, the inner diameter of the first gas distribution conduit 170 may be selected to vary pressure and flow rate along the length of the conduit 170. For example, the first gas distribution conduit 170 may have a varying cross-section along the length of the conduit—such as a larger diameter cross section proximate the peripheral edge 204 of the substrate support 124 and a smaller diameter cross section proximate the center 202 of the substrate support 124 to provide a similar flow rate at first outlets 171 at each location. Similarly, other suitable shapes of the first gas distribution conduit 170 may be used to manipulate the flow rate at each first outlet 171 along the length of the first gas distribution conduit 170, for example, such as varying wall thickness to vary the pressure drop across each first outlet 171, or the like.

Figure 2A:
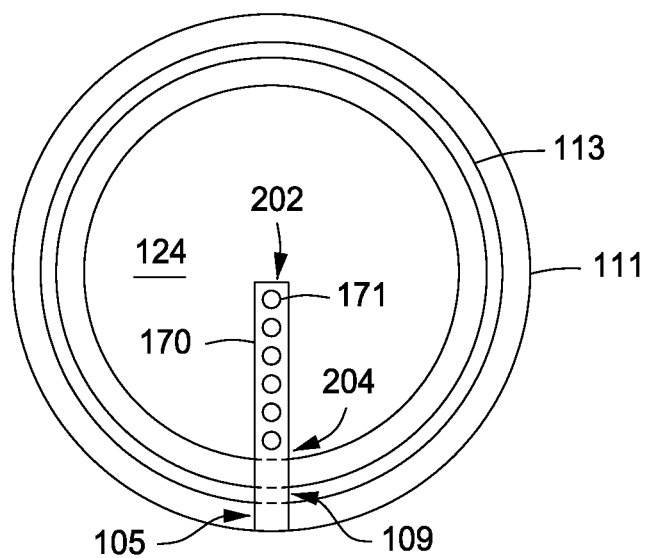
FIGS. 2A-D depict a partial schematic top view of a process chamber showing configurations of one or more conduits in the process chamber in accordance with some embodiments of the present invention.

As illustrated in FIGS. 2A-D, the position of the one or more first outlets 171 along the length of the first conduit 170 may vary to provide the third process gas to a desired region of the substrate 125. For example, as illustrated in FIG. 2A, the one or more outlets 171 of the first gas distribution conduit 170 may be a plurality of outlets that extend along the length of the first gas distribution conduit 170 from about the center 202 of the substrate support 124 to about the peripheral edge 204 of the substrate support 124. For example, an arrangement of the first outlets 171 as illustrated in FIG. 2A may be utilized to provide the third gas to the entire processing surface 123 of the substrate 125 as the substrate 125 is rotated on the substrate support 124.

Figure 2B:
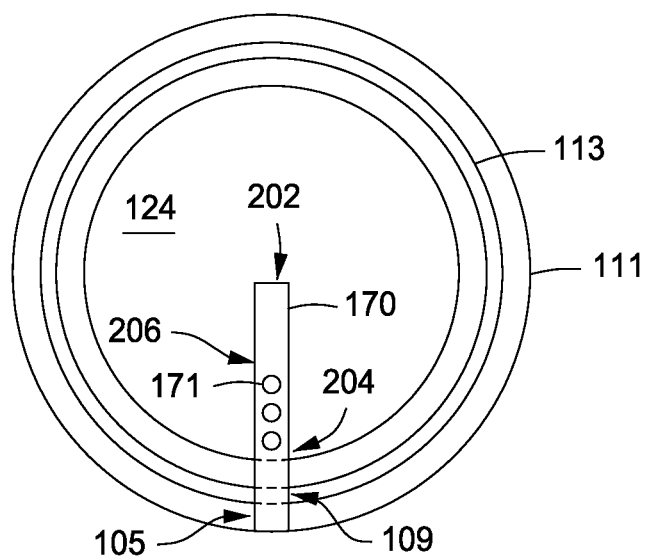

Alternatively, as illustrated in FIG. 2B, the one or more first outlets 171 may be a plurality of outlets that extend along the length of the first gas distribution conduit 170 from about the peripheral edge 204 of the substrate support 124 to about an interior portion 206 of the substrate support 124 disposed between the peripheral edge 204 and the center 202 of the substrate support 124. For example, an arrangement of the first outlets 171 as illustrated in FIG. 2B may be utilized to provide the third gas to only an outer portion of the processing surface 123 of the substrate 125 as the substrate 125 is rotated on the substrate support 124.

Figure 2C:
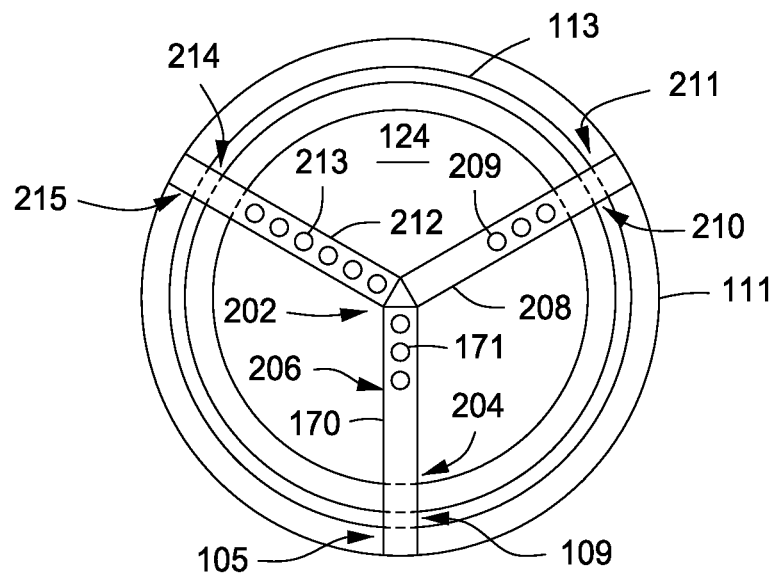

Alternatively, as illustrated in FIG. 2C, the one or more first outlets 171 may be a plurality of outlets that extend along the length of the first gas distribution conduit 170 from about the center 202 of the substrate support 124 to about the interior portion 206 of the substrate support 124 disposed between the peripheral edge 204 and the center 202 of the substrate support 124. For example, an arrangement of the first outlets 171 as illustrated in FIG. 2C may be utilized to provide the third gas to only an inner portion of the processing surface 123 of the substrate 125 as the substrate 125 is rotated on the substrate support 124. In some embodiments, the one or more first outlets 171 may be a single outlet 171 disposed proximate any of the aforementioned locations to provide the third process gas to a desired location on the substrate 125.

As illustrated in FIG. 2C, the process chamber 100 may include a plurality of gas distribution conduits. For example, each gas distribution conduit may be utilized to provide different process gases, to provide the same process gas to different locations of the substrate, to provide different mixtures of process gases, or the like. For example, the process chamber 100 may include a second gas distribution conduit 208 disposed above the substrate support 124 and having one or more second outlets 209 disposed along the length of the second gas distribution conduit 208 to provide a fourth gas to the processing surface 123 of the substrate 125. As discussed above, the fourth gas may be the same, different, or a combination of any of the process gases discussed above. The one or more second outlets 209 may arranged along the length of the second gas distribution conduit 208 in any desired embodiment, such as those discussed above for the plurality of first outlets 171. For example, the one or more second outlets 209 may be substantially linearly arranged along the length of the second gas distribution conduit 208. The second gas distribution conduit 208 may have any suitable configuration, shape, or the like, such as those discussed above for the first gas distribution conduit 170. Similarly, the spacer liner 113 may include a second opening 210, where the second gas distribution conduit 208 may extend through the second opening 210 in the spacer liner 113 and into the process chamber 100. For example, a corresponding opening 211 may be present in the spacer ring 111 to accept and/or mount the second gas distribution conduit 208 thereon and therethrough.

For example, the process chamber 100 may include a third gas distribution conduit 212 disposed above the substrate support 124 and having one or more third outlets 213 disposed along the length of the third gas distribution conduit 212 to provide a fifth gas to the processing surface 123 of the substrate 125. As discussed above, the fifth gas may be the same, different, or a combination of any of the process gases discussed above. The third outlets 213 may arranged along the length of the third gas distribution conduit 212 in any desired embodiment, such as those discussed above for the plurality of first outlets 171. For example, the one or more third outlets 213 may be substantially linearly arranged along the length of the third gas distribution conduit 212. The third gas distribution conduit 212 may have any suitable configuration, shape, or the like, such as those discussed above for the first gas distribution conduit 170. Similarly, the spacer liner 113 may include a third opening 214, where the third gas distribution conduit 212 may extend through the third opening 214 in the spacer liner 113 and into the process chamber 100. For example, a corresponding opening 215 may be present in the spacer ring 111 to accept and/or mount the third gas distribution conduit 212 thereon and therethrough.

Figure 2D:
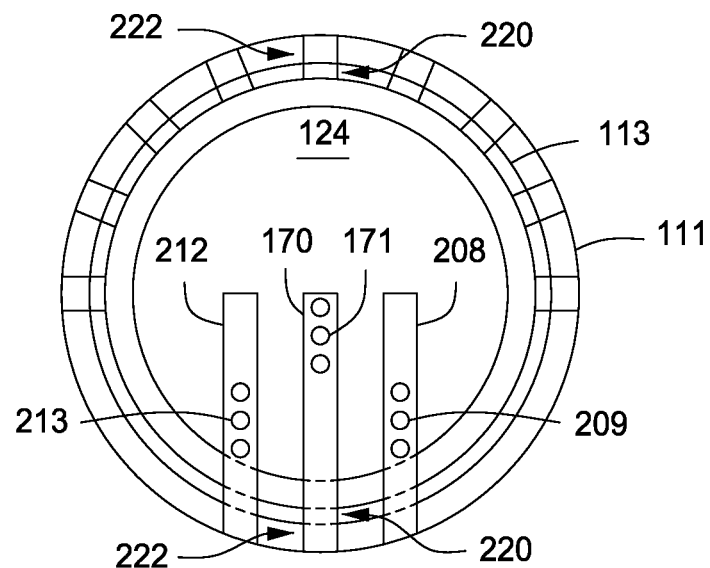

Alternative and/or additional arrangements of the plurality of conduits 170, 208, 212 are illustrated in FIG. 2D. For example, as illustrated in FIG. 2D, the spacer liner 113 may include a plurality of openings 220. Similarly, a plurality of corresponding openings 222 may be present in the spacer ring 111 to accept and/or mount additional gas distribution conduits thereon and therethrough and/or to move existing gas distribution conduits, such as conduits 170, 208, 212 to alternative positions. For example, as illustrated in FIG. 2D, such alternative positions may include a configuration where each of the conduits 170, 208 and 212 are substantially parallel to each other. Further, (not shown), each of the plurality of corresponding openings 222 not having a gas distribution conduit mounted thereon may be covered by a fitting, flange, or the like.

Returning to FIG. 1, the upper chamber liner 116A may be disposed above the gas inlet port 114 and the exhaust manifold 118 and below the chamber lid 106, as depicted. In some embodiments the upper chamber liner 116A may comprises a material, such as quartz or the like, for example, to at least partially reflect energy as discussed above. In some embodiments, the upper chamber liner 116A, the chamber lid 106, and a lower chamber liner 131 (discussed below) may be quartz, thereby advantageously providing a quartz envelope surrounding the substrate 125.

The lower portion 104 generally comprises a baseplate assembly 119, a lower chamber liner 131, a lower dome 132, the substrate support 124, a pre-heat ring 122, a substrate lift assembly 160, a substrate support assembly 164, a heating system 151, and a lower pyrometer 158. The heating system 151 may be disposed below the substrate support 124 to provide heat energy to the substrate support 124 as illustrated in FIG. 1. However, in some embodiments, or in combination, the heating system may be disposed above the substrate support 124 (not shown). The heating system 151 may comprise one or more outer lamps 152 and one or more inner lamps 154. Although the term "ring" is used to describe certain components of the process chamber, such as the pre-heat ring 122, it is contemplated that the shape of these components need not be circular and may include any shape, including but not limited to, rectangles, polygons, ovals, and the like. The lower chamber liner 131 may be disposed below the gas inlet port 114 and the exhaust manifold 118, for example, and above the baseplate assembly 119. The gas inlet port 114 and the exhaust manifold 118 are generally disposed between the upper portion 102 and the lower portion 104 and may be coupled to either or both of the upper portion 102 and the lower portion 104.

As illustrated in FIG. 1, the gas inlet port 114 and exhaust manifold 118 may be coupled to the temperature-controlled reaction volume 101 via respective openings in the portion 117 of the chamber body 110. For example, in some embodiments, the space 115A may be at least partially formed by the upper and lower chamber liners 116, 131 on the first side 121 of the substrate support 124. The gas inlet port 114 may be fluidly coupled to the temperature-controlled reaction volume 101 via the space 115A.

Figure 3A:
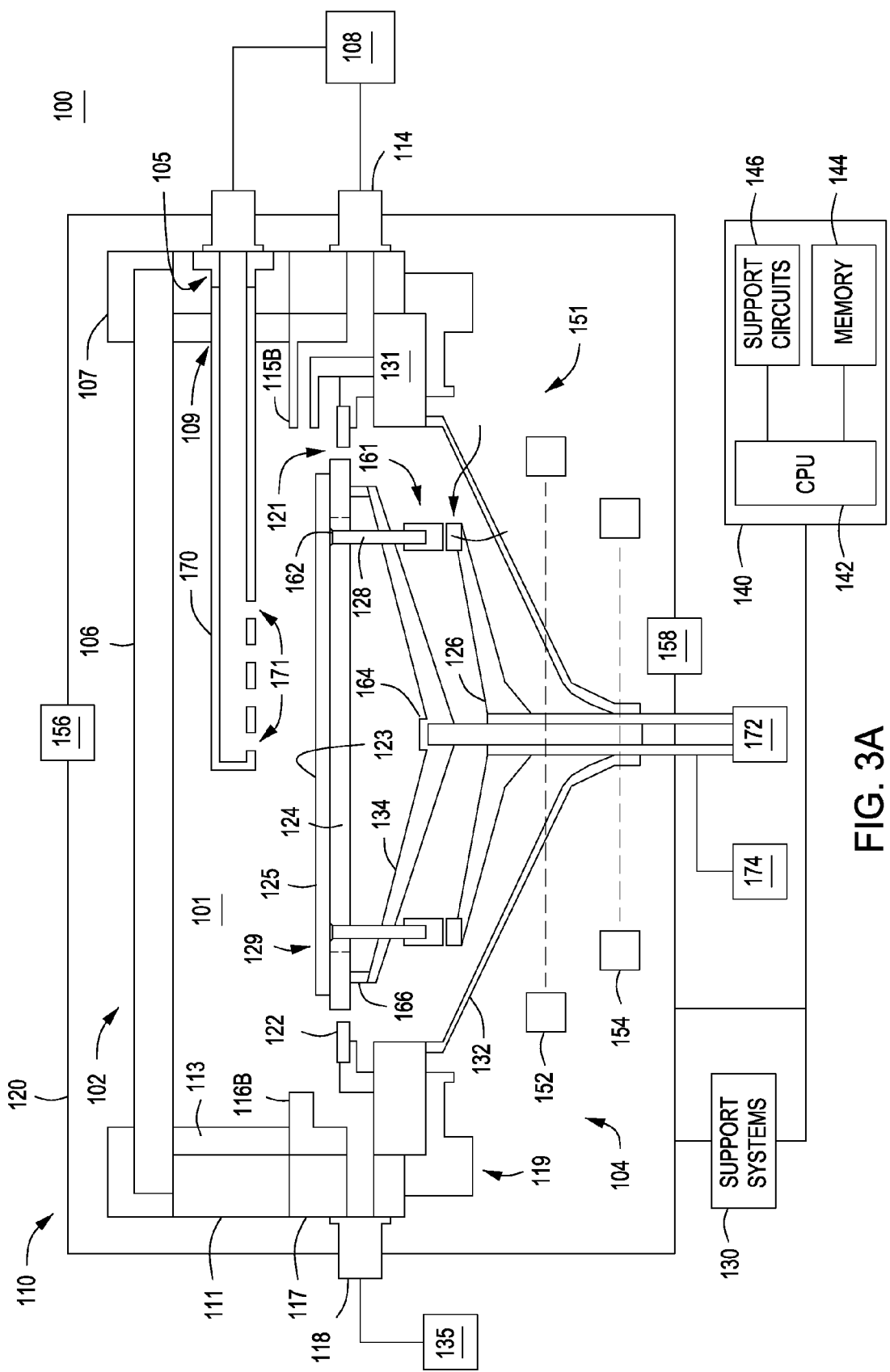
FIG. 3A depicts a schematic side view of a process chamber in accordance with some embodiments of the present invention.

Alternatively, as illustrated in FIG. 3A, the injector 115B may be utilized in place of the space 115A. For example, the injector 115B may be capable of providing the first and second process gases separately, such as via individual injector ports as discussed below. For example, the space 115A may provide the first and second gases together. Embodiments of the process chamber 100 as illustrated in FIG. 3A are substantially similar to those illustrated in FIG. 1, with the exception of an upper chamber liner 116B and the injector 115B, which differ from the upper chamber liner 116A and the space 115A, respectively. For example, the upper chamber liner 116B may be substantially similar to the upper chamber liner 116A with the exception that it does not extend along the first side 121 of the substrate support 124 as illustrated in FIG. 3A. In place of the upper chamber liner 116B on the first side 121 of the substrate support 124 is the injector 115B. For example, the upper chamber liner 116B may end on either side of the injector 115B as illustrated in FIG. 3B.

Figure 3B:
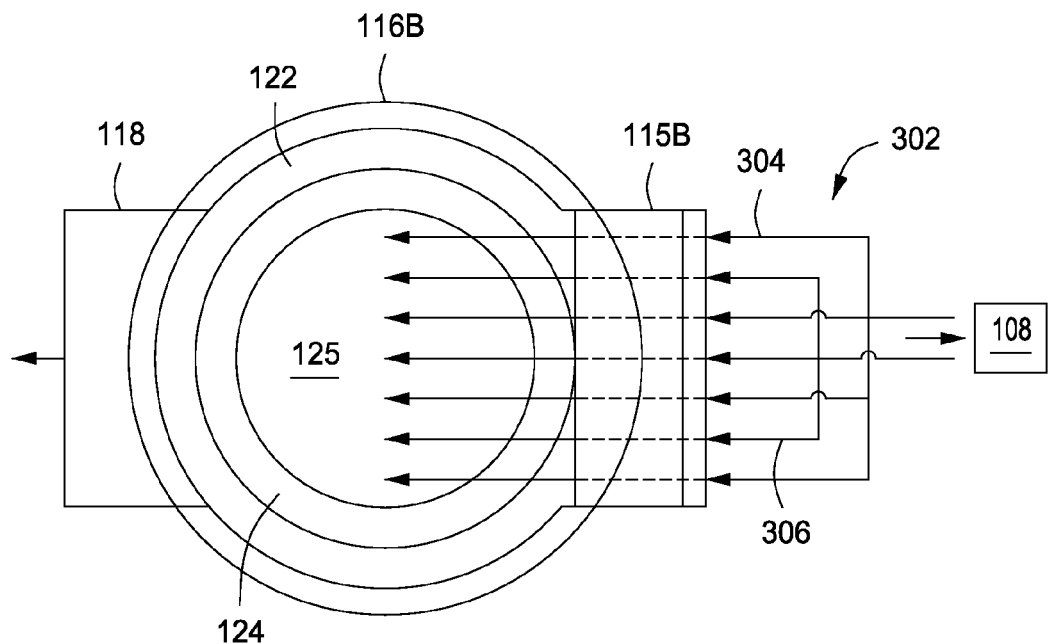
FIG. 3B depicts a partial schematic top view of a process chamber showing the configuration of a gas inlet port and an exhaust port of the process chamber in accordance with some embodiments of the present invention.

FIG. 3B depicts a partial schematic top view of the process chamber 100 showing the configuration of the injector 115B and the heated exhaust manifold 118. As illustrated, the injector 115B and the exhaust manifold 118 are disposed on opposing sides of the substrate support 124. The injector 115B may include a plurality of injector ports 302 to provide the process gases to the inner volume of process chamber 100. The plurality of injector ports 302 may be disposed periodically along a substrate facing edge of the injector 115B in a pattern suitable to provide a flow of the first and second process gases substantially across the processing surface 123 of the substrate 125. For example, the plurality of injector ports 302 may be disposed periodically along the substrate facing edge of the injector 115B from a first side of the injector 115B proximate a first side of the substrate 125 to an opposing second side of the injector 115B proximate a second side of the substrate 125. The exhaust manifold 118 may include an opening that is about the same width as the diameter of the substrate 125 or larger to facilitate removing the excess process gases and any process byproducts from the chamber while maintaining substantially laminar flow conditions.

In some embodiments, the plurality of injector ports 302 may be configured to provide the first and second process gases independently of each other. For example, the first process gas may be provided by a plurality of first injector ports 304 and the second process gas may be provided by a plurality of second injector ports 306. The size, number, and configuration of the plurality of first injector ports 304 may be controlled to provide a desired flow of the first process gas across the processing surface of the substrate. The size, number, and configuration of the plurality of second injector ports 306 may be independently controlled to provide a desired flow of the second process gas across the processing surface of the substrate. In addition, the relative size, number, and configuration of the plurality of first injector ports 304 as compared to the plurality of second injector ports 306 may be controlled to provide a desired concentration or flow pattern of the first process gas relative to the second process gas across the processing surface of the substrate.

Figure 3C:
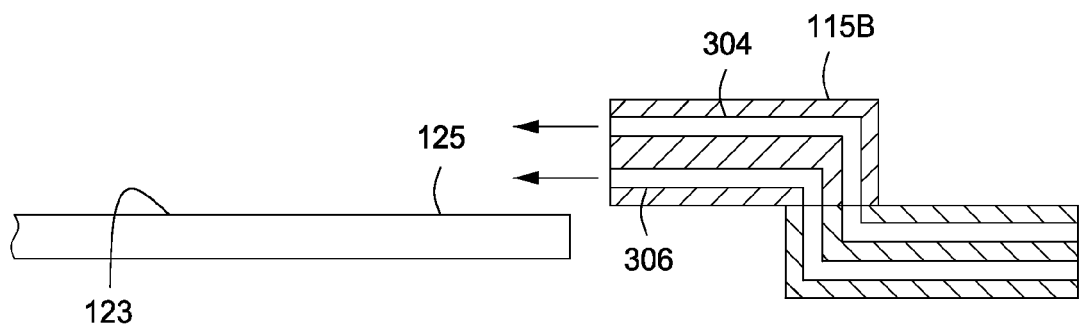
FIG. 3C depicts schematic side views of a gas inlet port in accordance with some embodiments of the present invention.

In one exemplary non-limiting embodiment, as illustrated in cross sectional view in FIG. 3C, the injector 115B may include the plurality of first injector ports 304 (e.g., a first flow path) to inject the first process gas and the plurality of second injector ports 306 (e.g., a second flow path) to inject the second process gas. As illustrated in FIG. 3C, the pluralities first and second injector ports 304, 306 may be in a horizontally non-planar arrangement with respect to each other. In some embodiments, each of the plurality of first injector ports 304 may be disposed above each of the plurality of second injector ports 306 (or vice-versa). Each of the plurality of first injector ports 304 may be disposed above each of the plurality of second injector ports 306 in any desired arrangement, such as in a parallel planar arrangement or the like. For example, a parallel planar arrangement may be where the pluralities of first and second injector ports 304, 306 are disposed in separate planes, wherein each plane is parallel to the processing surface 123 of the substrate 125. For example, in a parallel planar arrangement, each of the plurality of first injector ports 304 is disposed along a first plane at a first height above the substrate 125 and each of the plurality of second injector ports 306 is disposed along a second plane at a second height above the substrate 125 that differs from the first height. Alternatively, the first and second injector ports 304, 306 may be co-planar or in any desired arrangement that may be utilized to produce a layer having a desired composition, homogeneity, and thickness on the substrate 125.

Embodiments of the space 115A or the injector 115B and the first gas distribution conduit 170 (or the plurality of gas distribution conduits) as described above may be utilized to facilitate optimal deposition uniformity and composition control with minimal residue formation. For example, as discussed above, specific reactants, such as the first and second gases, may be directed through independently controllable injector ports of the injector 115B and/or outlets of the first gas distribution conduit 170. The injection scheme facilitated by the embodiments of the injector 115B and the first gas distribution conduit 170 may allow for matching the flow velocity and/or flow profile of each reactant with its reactivity relative to the other reactants flowing in the process chamber 100. For example, as discussed below the first process gas may be flowed at a higher flow velocity than the second process gas because the first process gas can be more reactive and may dissociate faster than the second process gas. Accordingly, to match the reactivity of the first and second process gases to limit residue formation, optimize uniformity and/or composition, the first process gas may be flowed at a higher velocity than the second process gas. The aforementioned injection scheme is merely exemplary, and other injection schemes are possible.

Returning to FIG. 1, the substrate support 124 may be any suitable substrate support, such as a plate (illustrated in FIG. 1) or ring (illustrated by dotted lines in FIG. 1) to support the substrate 125 thereon. The substrate support assembly 164 generally includes a support bracket 134 having a plurality of support pins 166 to couple the support bracket 134 to the substrate support 124. The substrate lift assembly 160 comprises a substrate lift shaft 126 and a plurality of lift pin modules 161 selectively resting on respective pads 127 of the substrate lift shaft 126. In one embodiment, a lift pin module 161 comprises an optional upper portion of the lift pin 128 that is movably disposed through a first opening 162 in the substrate support 124. In operation, the substrate lift shaft 126 is moved to engage the lift pins 128. When engaged, the lift pins 128 may raise the substrate 125 above the substrate support 124 or lower the substrate 125 onto the substrate support 124.

The substrate support 124 may further include a lift mechanism 172 and a rotation mechanism 174 coupled to the substrate support assembly 164. The lift mechanism 172 can be utilized to move the substrate support 124 in a direction perpendicular to the processing surface 123 of the substrate 125. For example, the lift mechanism 172 may be used to position the substrate support 124 relative to the gas distribution conduit 170 and the gas inlet port 114. The rotation mechanism 174 can be utilized for rotating the substrate support 124 about a central axis. In operation, the lift mechanism may facilitate dynamic control of the position of the substrate 125 with respect to the flow field created by the gas inlet port 114 and/or the gas distribution conduit 170. Dynamic control of the substrate 125 position in combination with continuous rotation of the substrate 125 by the rotation mechanism 174 may be used to optimize exposure of the processing surface 123 of the substrate 125 to the flow field to optimize deposition uniformity and/or composition and minimize residue formation on the processing surface 123.

During processing, the substrate 125 is disposed on the substrate support 124. The lamps 152, and 154 are sources of infrared (IR) radiation (i.e., heat) and, in operation, generate a pre-determined temperature distribution across the substrate 125. The chamber lid 106, the upper chamber liner 116, and the lower dome 132 may be formed from quartz as discussed above; however, other IR-transparent and process compatible materials may also be used to form these components. The lamps 152, 154 may be part of a multi-zone lamp heating apparatus to provide thermal uniformity to the backside of the substrate support 124. For example, the heating system 151 may include a plurality of heating zones, where each heating zone includes a plurality of lamps. For example, the one or more lamps 152 may be a first heating zone and the one or more lamps 154 may be a second heating zone. The lamps 152, 154 may provide a wide thermal range of about 200 to about 900 degrees Celsius on the processing surface 123 of the substrate 125. The lamps 152, 154 may provide a fast response control of about 5 to about 20 degrees Celsius per second on the processing surface 123 of the substrate 125. For example, the thermal range and fast response control of the lamps 152, 154 may provide deposition uniformity on the substrate 125. Further, the lower dome 132 may be temperature controlled, for example, by active cooling, window design or the like, to further aid control of thermal uniformity on the backside of the substrate support 124, and/or on the processing surface 123 of the substrate 125.

The temperature-controlled reaction volume 101 may be formed by the chamber lid 106 and a plurality of chamber components. For example, such chamber components may include one or more of the chamber lid 106, the spacer liner 113, the upper chamber liner 116A (or upper chamber liner 116B), the lower chamber liner 131 and the substrate support 124. The temperature controlled-processing volume 101 may include interior surfaces comprising quartz, such as the surfaces of any one or more of the chamber components that form the temperature-controlled reaction volume 101. The temperature-controlled reaction volume 101 may be about 20 to about 40 liters. The volume 101 may accommodate any suitably sized substrate, for example, such as 200 mm, 300 mm or the like. For example, in some embodiments, if the substrate 125 is about 300 mm, then the interior surfaces, for example of the upper and lower chamber liners 116A, 131 may be, in a non-limiting example, about 50 mm to about 70 mm away from the edge of the substrate 125. For example, in some embodiments, the processing surface 123 of the substrate 125 may be up to about 100 millimeters, or ranging from about 10 mm to about 25 mm from chamber lid 106.

The temperature-controlled reaction volume 101 may have a varying volume, for example, the size of the volume 101 may shrink when the lift mechanism 172 raises the substrate support 124 closer to the chamber lid 106 and expand when the lift mechanism 172 lowers the substrate support 124 away from the chamber lid 106. The temperature-controlled reaction volume 101 may be cooled by one or more active or passive cooling components. For example, the volume 101 may be passively cooled by the walls of the process chamber 100, which for example, may be stainless steel or the like. For example, either separately or in combination with passive cooling, the volume 101 may be actively cooled, for example, by flowing a coolant about the chamber 100. For example, the coolant may be a gas or fluid.

The support systems 130 include components used to execute and monitor pre-determined processes (e.g., growing epitaxial silicon films) in the process chamber 100. Such components generally include various sub-systems. (e.g., gas panel(s), gas distribution conduits, vacuum and exhaust sub-systems, and the like) and devices (e.g., power supplies, process control instruments, and the like) of the process chamber 100.

The controller 140 may be coupled to the process chamber 100 and support systems 130, directly (as shown in FIG. 1) or, alternatively, via computers (or controllers) associated with the process chamber and/or the support systems. The controller 140 may be one of any form of general-purpose computer processor that can be used in an industrial setting for controlling various chambers and sub-processors. The memory, or computer-readable medium, 144 of the CPU 142 may be one or more of readily available memory such as random access memory (RAM), read only memory (ROM), floppy disk, hard disk, or any other form of digital storage, local or remote. The support circuits 146 are coupled to the CPU 142 for supporting the processor in a conventional manner. These circuits include cache, power supplies, clock circuits, input/output circuitry and subsystems, and the like.

Figure 4:
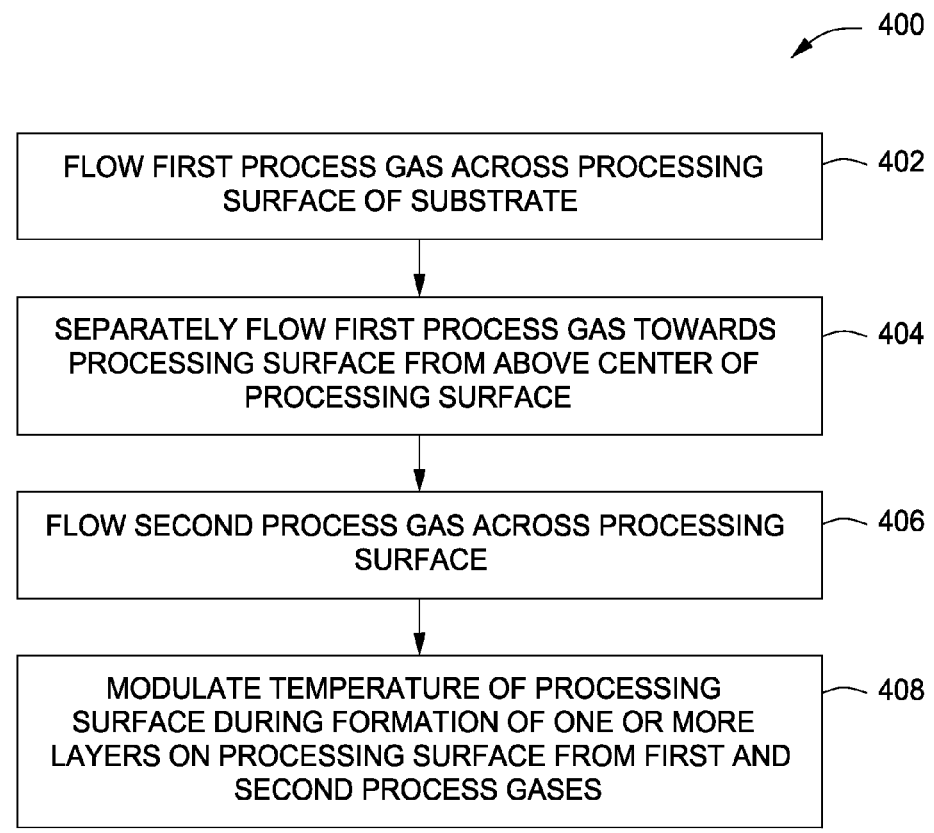
FIG. 4 depicts a flow chart of method for depositing a layer on a substrate in accordance with some embodiments of the present invention.

FIG. 4 depicts a flow chart for a method 400 of depositing a layer 500 on the substrate 125. The method 400 is described below in accordance with embodiments of the process chamber 100. However, the method 400 may be used in any suitable process chamber capable of providing the elements of the method 400 and is not limited to the process chamber 100.

Figure 5:
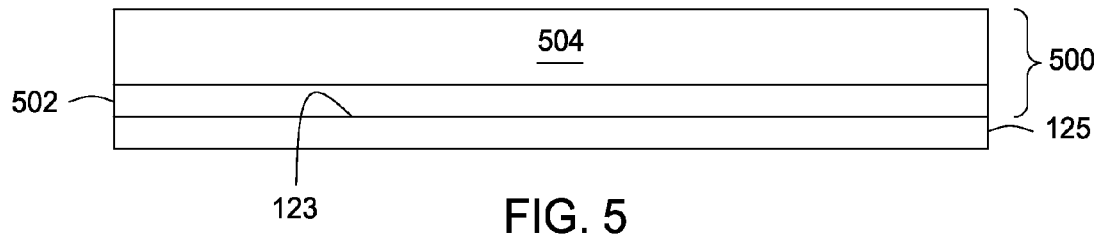
FIG. 5 depicts a layer deposited on a substrate in accordance with some embodiments of the present invention.

The one or more layers 500 is illustrated in FIG. 5 and may be any suitable one or more layers that can be deposited on the substrate 125. For example, the one or more layers 500 may comprises a III-V material, or any other suitable material, such as one or more materials used in the deposition of the advanced compound thin films as mentioned above. The one or more layers 500 may be an element of a device, for example, such as the channel of a transistor device or the like.

The method 400 may, optionally begin, by cleaning surfaces of, and/or establishing a temperature within, the temperature-controlled reaction volume 101 (e.g., a processing volume) prior to introducing the substrate 125 into the temperature-controlled reaction volume 101. For example, prior to and/or after layer formation on each substrate 125, the chamber 100 may be cleaned in-situ to maintain low particle levels and/or limit residue accumulation on each substrate 125. For example, an in-situ cleaning process may include alternatively flowing the halogen gas and a purge gas through the space 115A or the injector 115B and/or first gas distribution conduit 170 (and optionally, the second and/or third gas distribution conduit 208, 212) to purge the chamber of residues or the like. For example, cleaning surfaces of the temperature-controlled reaction volume 101 may include etching the surfaces with a halogen gas and purging the processing volume with an inert gas. For example, the halogen gas may include one or more of chlorine ($Cl_2$), hydrogen chloride (HCl), nitrogen trifluoride ($NF_3$), or the like. The halogen gas may be applied to any suitable components of the temperature-controlled reaction volume 101, such as the substrate support 124, the upper and lower chamber liners 116, 131, the chamber lid 106 or the like.

Establishing the temperature within the temperature-controlled reaction volume 101 may include ramping the temperature to any suitable temperature at or near a temperature for performing a process on the processing surface 123 of the substrate 125 and stabilizing the temperature within a desired tolerance level of the desired temperature prior to introducing the substrate 125 into the volume 101.

The method 400 generally begins at 402 by flowing the first process gas across the processing surface 123 of the substrate 125. The first process gas may be flowed across the processing surface 123 by any of the embodiments discussed above for the space 115A or the plurality of first inlet ports 304 of the injector 115B. In some embodiments, the first process gas may dissociate readily and/or may react more quickly than the second process gas. For example, it may be necessary to minimize the residence time of the first process gas in the temperature-controlled reaction volume 101 relative to the second process gas. For example, minimizing the residence time of the first process gas may minimize depletion of the first process gas relative to the second process gas and improve composition and/or thickness uniformity in the one or more layers 500. Accordingly, in some embodiments, a smaller diameter may be provided for the first inlet ports 304 to provide a higher velocity for the first process gas such that the first process gas more rapidly reaches the substrate 125, or the center of the substrate 125, or closer to the center of the substrate 125 prior to dissociating or reacting. As such, the first process gas may be flowed at a higher flow rate than the second process gas. Similarly, in some embodiments, where the diameter of the first inject ports 304 may decrease from the edge to the center of the injector 115B, the flow rate of the first process gas may be higher across the center of the processing surface than across the edge of the processing surface. In some embodiments, the first process gas may include one or more Group III elements in a first carrier gas. Exemplary first process gases include one or more of trimethylgallium, trimethylindium, or trimethylaluminum. Dopants and hydrogen chloride (HCl) may also be added to the first process gas.

At 404, the first process gas may be separately flowed towards the processing surface 123 from above the processing surface 123. For example, the first process gas may be flowed from the first gas distribution conduit 170 using any suitable embodiment of the first gas distribution conduit 170 as discussed above. Alternatively, or in combination, the first gas may be flowed from the second and/or third gas distribution conduits 208, 212. The first process gas may be flowed from the first gas distribution conduit 170 to ensure that an adequate amount of the first process gas reaches the center, peripheral edge, or any intermediate region of the process surface 123 and reacts to form the layer 500, for example, due to the higher reactivity of the first process gas. For example, the size of the outlets that are used to flow the first gas, such as one or more first outlets 171, may be smaller in diameter than other outlets, such as the second and/or third outlets 209, 213, which may be flowing a gas different from the first gas. However, the above-mentioned embodiment for the size of the first outlets 171 is merely exemplary, and any suitable diameter and/or configuration for each of the first, second, and third outlets 171, 209, 213 may be used, for example, depending on the particular process gas being provided.

The first process gas may be flowed from the space 115A or injector 115B and the first gas distribution conduit 170 in any suitable scheme, for example, such as simultaneous, alternating, or periodic flow or any suitable flow scheme to provide adequate coverage of the layer 500 over the processing surface 123 of the substrate 125. Alternatively, or in combination, an inert gas such as nitrogen ($N_2$) or hydrogen ($H_2$) may be flowed towards the processing surface 123 from above the processing surface 123.

At 406, the second process gas may be flowed across the processing surface 123. The second process gas may be flowed across the processing surface 123 by any of the embodiments discussed above for the space 115A or the plurality of second inlet ports 306 of the injector 115B. For example, the second process gas may be more slowly dissociated and/or less reactive than the first process gas. Accordingly, a larger diameter for the second inlet ports 306 may be used to provide a lower velocity for the second process gas such that the second process gas enters the process chamber 100 more slowly than the first process gas and can dissociate while moving across a greater portion of the surface of the substrate. As such, the second process gas may be flowed at a lower flow rate than the first process gas.

Similarly, because the diameter of the second inject ports 306 may decrease from the edge to the center of the injector 115B, the flow rate of the second process gas may be higher across the center of the processing surface than across the edge of the processing surface. In some embodiments, the second process gas may include one or more Group V elements in a second carrier gas. Exemplary second process gases include one or more of arsine ($AsH_3$), phosphine ($PH_3$), tertiarybutyl arsine, tertiarybutyl phosphine, or the like. Dopants and hydrogen chloride (HCl) may also be added to the second process gas.

Optionally, at 406, the second gas may further be flowed from any suitable combination of the first, second, and/or third conduits 170, 208, 212 to provide the second gas to desired regions of the processing surface 123 from above the processing surface 123. For example, the diameter of each of the first, second and/or third outlets 171, 209, 213 may be varied as desired, for example, such as made larger to flow the second gas, or the like.

The first and second process gases may be flowed from the space 115A or injector 115B and the first gas distribution conduit 170 (and optional, second and/or third conduits 208, 212) in any suitable scheme, for example, such as simultaneous, alternating, or periodic flow or any suitable flow scheme to provide adequate coverage of the one or more layers 500 over the processing surface 123.

At 408, the temperature of the processing surface 123 of the substrate 125 may be modulated to form one or more layers 500 on the processing surface 123 of the substrate 125 from the first and second process gases. For example, modulating the temperature may include heating and cooling the temperature-controlled processing volume 101, such as heating or cooling any one or more of the components and/or interior surfaces making up the volume 101. For example, heating may include providing energy to a backside surface of the substrate support 124, wherein the substrate rest on the frontside surface of the substrate support 124. Heating may be provided prior and/or during flow of the first and second process gases. Heating may be continuous or discontinuous, and in any desired scheme, such as periodic or the like. Heating may provide any desired temperature profile to the substrate 125 prior to and/or during the flow of the first and second process gases to achieve deposition of the layer 500 on the processing surface 123. Heating may be provided by the lamps 152, 154. The lamps 152, 154 may be capable of increasing the substrate temperature from about 5 degrees Celsius per second to about 20 degrees Celsius per second on the process surface 123 of the substrate 125. The lamps 152, 154 may be capable of providing a temperature to the processing surface 123 of the substrate 125 ranging from about 200 to about 900 degrees Celsius.

The lamps 152, 154 may be utilized in combination with other components, such as the cooling mechanisms and apparatus discussed above to modulate the temperature of the processing surface 123 from about 5 degrees Celsius per second to about 20 degrees Celsius per second. For example, the one or more layers may include a first layer 502 and a second layer 504 deposited atop the first layer 502 as illustrated in FIG. 5. For example, a first layer 502 may be deposited on the processing surface 123 at a first temperature. For example, the first layer 502 may be a nucleation layer or the like. A second layer 504 may be deposited atop the first layer 502 at a second temperature. For example, the second layer 504 may be a bulk layer or the like. In some embodiments, the second temperature may be higher than the first temperature. The deposition of the first and second layers 502, 504 may be repeated, for example, depositing a first layer 502 at a first temperature, depositing the second layer 504 at the second temperature higher than the first temperature, and then depositing an additional first layer 502 atop the second layer 504 at the first temperature, and so on until a desired layer thickness has been achieved.

Additional and/or alternative embodiments of the method 400 are possible. For example, the substrate 125 may be rotated while depositing the one or more layers, such as the first and second layers 502, 504. Separately, or in combination, the position of the process surface 123 may be changed relative to the flow streams of the first and second process gases to adjust composition of the one or more layers. For example, the lift mechanism 174 may be used to raise and/or lower the position of the processing surface 123 relative to the space 115A or the injector 115B and/or first gas distribution conduit 170 while the first and/or second process gases are flowing to control the composition of the one or more layers.

Thus, improved methods and apparatus for deposition of advanced compound thin films have been provided herein. Embodiments of the inventive methods and apparatus may advantageously provide for the deposition of improved advanced compound thin films suitable for CMOS applications as compared to films deposited via conventional deposition apparatus.

While the foregoing is directed to embodiments of the present invention, other and further embodiments of the invention may be devised without departing from the basic scope thereof.

The invention claimed is:

1. An apparatus for processing a substrate, comprising:
   a process chamber having a substrate support;
   a heating system to provide heat energy to the substrate support;
   a gas inlet port disposed to a first side of the substrate support to provide at least one of a first process gas or a second process gas across a processing surface of the substrate;
   a first gas distribution conduit disposed above the substrate support and having one or more first outlets disposed along a length of the first gas distribution conduit to provide a third process gas to the processing surface of the substrate, wherein the one or more first outlets are substantially linearly arranged, and wherein the first gas distribution conduit extends into the process chamber from a side wall of the process chamber and cantilevered over the processing surface of the substrate;
   a spacer ring disposed above the substrate support and having a first opening formed in a side wall of the spacer ring, wherein the first gas distribution conduit extends through the first opening and into the process chamber;
   an exhaust manifold disposed to a second side of the substrate support opposite the gas inlet port to exhaust the process gases from the process chamber; and
   a controller coupled to the process chamber, wherein the controller is configured to control a flow of the first and second process gases through the gas inlet port and a flow of the third process gas through the first gas distribution conduit.

2. The apparatus of claim 1, wherein the one or more first outlets of the first gas distribution conduit extend along the length of the first gas distribution conduit from about a center of the substrate support to about a peripheral edge of the substrate support.

3. The apparatus of claim 1, wherein the one or more first outlets of the first gas distribution conduit extend along the length of the first gas distribution conduit from about a center of the substrate support to about an interior portion of the substrate support disposed between a peripheral edge and the center of the substrate support.

4. The apparatus of claim 1, wherein the one or more first outlets of the first gas distribution conduit extend along the length of the first gas distribution conduit from about a peripheral edge of the substrate support to about an interior portion of the substrate support disposed between the peripheral edge and a center of the substrate support.

5. The apparatus of claim 1, further comprising:
a second conduit disposed above the substrate support and having a one or more second outlets disposed along the length of the second conduit to provide a fourth gas that is different than the third process gas provided by the first gas distribution conduit to the processing surface of the substrate, wherein the one or more second outlets are substantially linearly arranged.

6. The apparatus of claim 5, further comprising:
a third conduit disposed above the substrate support and having a one or more third outlets disposed along the length of the third conduit to provide a fifth gas that is different than the third process gas provided by the first gas distribution conduit to the processing surface of the substrate, wherein the one or more third outlets are substantially linearly arranged.

7. The apparatus of claim 1, further comprising:
a temperature-controlled reaction volume including interior surfaces comprising quartz and having the substrate support disposed within the temperature-controlled reaction volume.

8. The apparatus of claim 7, wherein the temperature-controlled reaction volume is at least partially formed by a plurality of chamber components including:
a chamber lid disposed above the substrate support;
an upper chamber liner disposed adjacent to the substrate support and above the gas inlet port and the exhaust manifold and below the chamber lid; and
a lower chamber liner disposed adjacent to the substrate support and below the gas inlet port and the exhaust manifold, wherein the spacer ring is disposed above the upper chamber liner and below the chamber lid.

9. The apparatus of claim 8, wherein the spacer ring further comprises:
a spacer liner having a first opening, wherein the first gas distribution conduit extends through the first opening formed in a side wall of the spacer liner, the first opening formed in the side wall of the spacer ring, and into the process chamber.

10. The apparatus of claim 8, further comprising:
a space at least partially formed by the upper and lower chamber liners on the first side of the substrate support, wherein the gas inlet port is fluidly coupled to the temperature-controlled reaction volume via the space.

11. The apparatus of claim 8, further comprising:
an injector disposed to the first side of the substrate support and fluidly coupling the gas inlet port to the temperature-controlled reaction volume, the injector having a first flow path to provide the first process gas and a second flow path to provide the second process gas independent of the first process gas, wherein the injector is positioned to provide the first and second process gases across the processing surface of the substrate.

12. The apparatus of claim 11, wherein the injector further comprises:
a plurality of first injector ports to inject the first process gas; and
a plurality of second injector ports to inject the second process gas.

13. The apparatus of claim 1, wherein the substrate support further comprises:
a rotation mechanism to rotate the substrate support; and
a lift mechanism to position the substrate support relative to the first gas distribution conduit.

14. The apparatus of claim 1, wherein the heating system further comprises:
a plurality of heating zones, wherein each one of the plurality of heating zones includes a plurality of lamps.

15. An apparatus for processing a substrate, comprising:
a process chamber having a temperature-controlled reaction volume including interior surfaces comprising quartz and having a substrate support disposed within the temperature-controlled reaction volume to support a substrate;
a chamber lid disposed above the substrate support;
a heating system to provide heat energy to the substrate support;
a gas inlet port disposed to a first side of the substrate support to provide at least one of a first process gas or a second process gas across a processing surface of the substrate;
a first gas distribution conduit disposed above the substrate support and having a plurality of first outlets disposed along a length of the first gas distribution conduit to provide a third process gas to the processing surface of the substrate, wherein the plurality of first outlets are substantially linearly arranged along the length of the first gas distribution conduit ranging from above about a center of the substrate support to above about a peripheral edge of the substrate support, wherein the first gas distribution conduit is fluidly coupled to a side wall of the process chamber and cantilevered over the processing surface of the substrate, and wherein first gas distribution conduit has a tubular cross-section and is spaced apart from the chamber lid;
an exhaust manifold disposed to a second side of the substrate support, opposite the gas inlet port, to exhaust the first and second process gases from the process chamber; and
a controller coupled to the process chamber, wherein the controller is configured to control a flow of the first and second process gases through the gas inlet port and a flow of the third process as through the first as distribution conduit.

16. The apparatus of claim 15, wherein the temperature-controlled reaction volume is at least partially formed by a plurality of chamber components including:
the chamber lid;
an upper chamber liner disposed adjacent to the substrate support and above the gas inlet port and the exhaust manifold and below the chamber lid;
a lower chamber liner disposed adjacent to the substrate support and below the gas inlet port and the exhaust manifold; and
a spacer liner disposed above the upper chamber liner and below the chamber lid, the spacer liner having a first opening wherein the first gas distribution conduit extends through the first opening in the spacer liner and into the process chamber.

17. The apparatus of claim 16, further comprising:
a second conduit disposed above the substrate support and having a plurality of second outlets disposed along the length of the second conduit to provide a fourth gas to the processing surface of the substrate, wherein the plurality of second outlets are substantially linearly arranged; and wherein the spacer liner further comprises:
a second opening, wherein the second conduit extends through the second opening in the spacer liner and into the process chamber.

18. The apparatus of claim 17, further comprising:
a third conduit disposed above the substrate support and having a plurality of third outlets disposed along the length of the third conduit to provide a fifth gas to the processing surface of the substrate, wherein the plurality of third outlets are substantially linearly arranged; and wherein the spacer liner further comprises:
a third opening, wherein the third conduit extends through the third opening in the spacer liner and into the process chamber.

19. The apparatus of claim 18, further comprising:
a space at least partially formed by the upper and lower chamber liners on the first side of the substrate support, wherein the gas inlet port is fluidly coupled to the temperature-controlled reaction volume via the space.

20. The apparatus of claim 18, further comprising:
an injector disposed to the first side of the substrate support and fluidly coupling the gas inlet port to the temperature-controlled reaction volume, the injector having a first flow path to provide the first process gas and a second flow path to provide the second process gas independent of the first process gas, wherein the injector is positioned to provide the first and second process gases across the processing surface of the substrate.

* * * * *

UNITED STATES PATENT AND TRADEMARK OFFICE
CERTIFICATE OF CORRECTION

PATENT NO. : 9,499,905 B2
APPLICATION NO. : 13/547487
DATED : November 22, 2016
INVENTOR(S) : Mehmet Tugrul Samir et al.

It is certified that error appears in the above-identified patent and that said Letters Patent is hereby corrected as shown below:

In the Specification

In Column 8, Line 39, replace "the injector 1158" with "the injector 115B".

In the Claims

In Claim 15, Column 16, Line 51, replace "process as through the first as distribution" with "process gas through the first gas distribution".

Signed and Sealed this
Ninth Day of May, 2017

Michelle K. Lee
*Director of the United States Patent and Trademark Office*